(12) United States Patent
Singer et al.

(10) Patent No.: US 11,251,587 B2
(45) Date of Patent: Feb. 15, 2022

(54) LASER DIODE AND METHOD FOR MANUFACTURING A LASER DIODE

(71) Applicant: OSRAM OLED GMBH, Regensburg (DE)

(72) Inventors: Frank Singer, Regenstauf (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/612,799

(22) PCT Filed: May 30, 2018

(86) PCT No.: PCT/EP2018/064274
§ 371 (c)(1),
(2) Date: Nov. 12, 2019

(87) PCT Pub. No.: WO2018/220062
PCT Pub. Date: Dec. 6, 2018

(65) Prior Publication Data
US 2020/0203920 A1 Jun. 25, 2020

(30) Foreign Application Priority Data
Jun. 2, 2017 (DE) .......................... 102017112235.4

(51) Int. Cl.
*H01S 5/00* (2006.01)
*H01S 5/183* (2006.01)
(Continued)

(52) U.S. Cl.
CPC ........ *H01S 5/18386* (2013.01); *H01S 5/0225* (2021.01); *H01S 5/18388* (2013.01);
(Continued)

(58) Field of Classification Search
CPC ............... H01S 5/18386; H01S 5/0255; H01S 5/18388; H01S 5/423; H01S 5/18391
See application file for complete search history.

(56) References Cited

U.S. PATENT DOCUMENTS 5,633,527 A * 5/1997 Lear .................... G02B 6/12004
257/101
5,925,898 A * 7/1999 Spath ...................... H01L 33/58
257/98

(Continued)

FOREIGN PATENT DOCUMENTS

CN 1524328 A 8/2004
CN 101546737 A 9/2009
(Continued)

*Primary Examiner* — Kinam Park
(74) *Attorney, Agent, or Firm* — Slater Matsil, LLP

(57) ABSTRACT

A laser diode and a method for manufacturing a laser diode are disclosed. In an embodiment a laser diode includes a surface emitting semiconductor laser configured to emit electromagnetic radiation and an optical element arranged downstream of the semiconductor laser in a radiation direction, wherein the optical element includes a diffractive structure or a meta-optical structure or a lens structure, and wherein the optical element and the semiconductor laser are cohesively connected to each other.

20 Claims, 9 Drawing Sheets

(51) Int. Cl.
*H01S 5/42* (2006.01)
*H01S 5/0225* (2021.01)

(52) U.S. Cl.
CPC .......... *H01S 5/18391* (2013.01); *H01S 5/423* (2013.01); *H01S 2301/176* (2013.01)

(56) References Cited

U.S. PATENT DOCUMENTS

| | | |
|---|---|---|
| 6,002,705 A | 12/1999 | Thornton |
| 6,735,234 B1 | 5/2004 | Paschotta et al. |
| 7,333,522 B2 | 2/2008 | Ostermann et al. |
| 7,535,949 B2 | 5/2009 | Wang et al. |
| 8,455,279 B2 | 6/2013 | Johnson et al. |
| 9,285,102 B2 | 3/2016 | Streppel |
| 2002/0141062 A1 | 10/2002 | Christoffersen et al. |
| 2003/0197184 A1* | 10/2003 | Kaneko ............... H01S 5/04254 257/79 |
| 2004/0036078 A1 | 2/2004 | Kondo |
| 2005/0249450 A1* | 11/2005 | Schrodinger ..... H01L 27/14618 385/14 |
| 2010/0187449 A1* | 7/2010 | Schemmann ....... H01S 5/02325 250/552 |
| 2011/0243178 A1* | 10/2011 | Kolb ....................... H01S 5/423 372/92 |
| 2012/0051685 A1* | 3/2012 | Su ........................ H01S 5/0234 385/14 |
| 2013/0070797 A1 | 3/2013 | Wittmann et al. |
| 2013/0223466 A1* | 8/2013 | Gronenborn .......... H01S 5/0267 372/50.124 |
| 2015/0155270 A1 | 6/2015 | Rossi |
| 2015/0168659 A1 | 6/2015 | Lai et al. |
| 2016/0301188 A1* | 10/2016 | Mathai ................. G02B 5/1857 |
| 2019/0245326 A1 | 8/2019 | Halbritter et al. |
| 2020/0028329 A1* | 1/2020 | Gronenborn .......... H01S 5/1833 |

FOREIGN PATENT DOCUMENTS

| | | |
|---|---|---|
| CN | 102998281 A | 3/2013 |
| CN | 103003967 A | 3/2013 |
| DE | 19527026 A1 | 2/1997 |
| DE | 102004063569 A1 | 9/2005 |
| DE | 202004021531 U1 | 9/2008 |
| DE | 102008030844 A1 | 12/2009 |
| DE | 112006003384 B4 | 1/2014 |
| DE | 102017100997 A1 | 7/2018 |

* cited by examiner

LASER DIODE AND METHOD FOR MANUFACTURING A LASER DIODE

This patent application is a national phase filing under section 371 of PCT/EP2018/064274, filed May 30, 2018, which claims the priority of German patent application 102017112235.4, filed Jun. 2, 2017, each of which is incorporated herein by reference in its entirety.

TECHNICAL FIELD

A laser diode is specified. In addition, a method of manufacturing a laser diode is specified.

SUMMARY OF INVENTION

Embodiments provide a laser diode with an improved radiation characteristic. Further embodiments provide a laser diode with a particularly compact design. Other embodiments provide a laser diode that is particularly eye safe. Yet other embodiments provide a method of manufacturing such a laser diode.

The laser diode, for example, is a semiconductor laser diode which is configured to emit electromagnetic radiation during normal operation. In particular, the laser diode is configured to emit coherent electromagnetic radiation of a wavelength range. For example, the power density distribution of the emitted electromagnetic radiation has a Gaussian profile transverse to the direction of propagation of the emitted electromagnetic radiation. The electromagnetic radiation is, for example, electromagnetic radiation in the spectral range from infrared radiation to UV radiation.

According to at least one embodiment, the laser diode comprises a surface emitting semiconductor laser configured to emit electromagnetic radiation. The semiconductor laser is, for example, formed by a semiconductor layer stack. In particular, the semiconductor laser comprises at least one active region configured to generate electromagnetic radiation during normal operation. Furthermore, the semiconductor laser may comprise interfaces at which electromagnetic radiation generated in the active area is at least partially reflected. For example, the surface-emitting semiconductor laser is configured to emit electromagnetic radiation in the stacking direction of the semiconductor layers during intended operation. In particular, the surface-emitting semiconductor laser is a VCSEL. A VCSEL (vertical-cavity surface-emitting laser) is a semiconductor laser in which the electromagnetic radiation is emitted transversely or perpendicular to the main plane of the semiconductor chip.

According to at least one embodiment of the laser diode, the laser diode comprises an optical element which is arranged downstream of the semiconductor laser in a radiation direction. In intended operation, a majority, at least 50%, in particular at least 90%, or all of the electromagnetic radiation emitted by the semiconductor laser strikes the optical element. The optical element is configured to influence the electromagnetic radiation emitted by the semiconductor laser. For example, the optical element is configured to focus or redirect the electromagnetic radiation emitted by the semiconductor laser or to adjust the radiation profile. In particular, the optical element can be configured to divide the electromagnetic radiation emitted by the semiconductor laser into several partial beams.

According to at least one embodiment, the optical element comprises a diffractive structure. The diffractive structure is configured to influence electromagnetic radiation emitted by the semiconductor laser. In particular, the diffractive structure is configured to influence electromagnetic radiation by diffraction. For example, the diffractive structure comprises periodically arranged elements at which the electromagnetic radiation emitted by the semiconductor laser is diffracted. The diffractive structure can comprise a plurality of nano- or microscale elements which are periodically arranged along the main plane of the optical element. In particular, the periodicity and spatial extent of the elements are in the order of the wavelength of the electromagnetic radiation emitted by the semiconductor laser.

The elements may, for example, be arranged on an outer surface of the optical element or completely surrounded on all sides by a material of the optical element. The elements can, for example, be regions which have different refractive indices, different absorption and/or different reflectivity from those of the materials surrounding the regions. For example, the elements of the diffractive structure can each be formed by a recess. In particular, the recesses may be filled with a non-gaseous material.

According to at least one embodiment, the optical element comprises a lens structure. The lens structure is configured to influence electromagnetic radiation emitted by the semiconductor laser, in particular by bending, diffraction or refraction. The lens structure may comprise one lens or one or more rows of lenses. For example, the lens structure forms a diffusor element.

According to at least one embodiment, the optical element comprises a meta-optical structure. The meta-optical structure is configured to influence electromagnetic radiation emitted by the semiconductor laser, in particular by bending, diffraction or refraction. The meta-optical structure may comprise substructures that can deflect magnetic and/or electromagnetic fields. The substructures can be subwavelength structures. For example, the substructures have a vertical expansion and/or a lateral expansion in the nanometer range. In particular, the mean vertical extent and/or the mean lateral extent of the substructures are between 100 nm and 1 µm inclusive, between 100 nm and 0.7 µm inclusive, between 100 nm and 0.5 µm inclusive, or between 100 nm and 0.3 µm inclusive.

In particular, the meta-optical structure may act as a lens. In particular, such a lens does not have a classical curved lens shape. The meta-optical structure is approximately flat, especially planar. For example, the meta-optical structure has a maximum roughness, which is determined by the vertical expansion of the substructures. The substructures can be arranged closely together. For example, the substructures can be columnar. The substructures can be arranged in such a way that the meta-optical structure as a whole mimics the function of a lens. In contrast to a classical lens, the meta-optical structure can be free of bulges and thus ultraflat.

According to at least one embodiment, the meta-optical structure or the lens structure or the diffractive structure is globally designed as a planar optical structure. The optical structure, especially the lens structure, may show local curvatures, for example local convex or concave curvatures. In particular, the lens structure has one or more optical substructures which have local curvatures, wherein the optical substructure or optical substructures preferably are formed as a planarization layer or are embedded in a planarization layer. The optical substructure may comprise one lens or one or more rows of lenses. The optical substructure and the planarization layer may be formed of materials of different refractive indices. The planarization layer can be formed as part of the lens structure or as part of the optical element. The substructures of the meta-optical structure can also be embedded in a planarization layer.

According to at least one embodiment of the laser diode, the meta-optic structure or the lens structure or the diffractive structure is embedded in the optical element. For example, the meta-optical structure or the lens structure or the diffractive structure is surrounded, in particular completely surrounded, by a material, such as a material of the optical element transmissive for radiation. This material may form an encapsulation layer that partially or completely encloses the meta-optical structure or the lens structure or the diffractive structure. The material of the encapsulation layer is preferably transmissive for radiation, in particular transmissive for radiation in the wavelength range or with respect to the major part of the wavelength range of the radiation emitted by the semiconductor laser or the laser diode. The material may have low absorption in the wavelength range of the radiation emitted by the semiconductor laser or laser diode, approximately less than 15%, 10% or less than 5%.

The encapsulation layer may be a planarization layer of the optical element. The meta-optical structure or lens structure or diffractive structure may be fully embedded in the encapsulation layer. In particular, the meta-optic structure or lens structure or diffractive structure does not have an outer surface that is not covered by the material of the encapsulation layer. For example, the material and a layer thickness of the encapsulation layer are chosen such that no more than 30%, 20%, 10%, 5% or 3% of the radiant power of the radiation emitted by the semiconductor laser is absorbed by the encapsulation layer.

According to at least one embodiment of the laser diode, the optical element and the semiconductor laser are cohesively connected to each other. For example, the optical element and the semiconductor laser are in direct mechanical contact with each other. It is also possible that the optical element and the semiconductor laser are connected to each other by a connection means or intermolecular forces such as Van-der-Waals bonds—for example by direct bonding. All connections in which the connecting partners are held together by atomic or molecular forces are referred to as cohesive connections. At the same time, they are non-detachable connections that can only be separated by destroying the connection means and/or the connecting partners.

According to at least one embodiment, the laser diode comprises a surface emitting semiconductor laser, which is configured to emit electromagnetic radiation, and an optical element which, is arranged downstream of the semiconductor laser in a radiation direction, wherein the optical element comprises a diffractive structure and the optical element and the semiconductor laser are cohesively connected to each other. It is possible that the optical element comprises a meta-optical structure or a lens structure instead of the diffractive structure.

A laser diode described here is based, among other things, on the following considerations. In order to adapt the radiation characteristics of a laser diode, an optical element can be subordinated to the laser diode with a diffractive optical structure, a meta-optical structure or a lens structure. For example, the optical element can be arranged on a frame or a housing, which surrounds the semiconductor laser in lateral directions, so that the optical element and the semiconductor laser are arranged at a distance from each other. In particular, the optical element may be configured to influence the electromagnetic radiation emitted by the semiconductor laser after the electromagnetic radiation has passed through a region between the semiconductor laser and the optical element which is filled, for example, with gas.

The laser diode described here makes use of the idea of connecting the optical element and the semiconductor laser. A particularly small distance between the optical element and the semiconductor laser enables a particularly compact design of the laser diode. Furthermore, the cohesive connection of the optical element and the semiconductor laser simplifies the alignment of the optical element relative to the semiconductor laser. The advantage of this is that the laser diode is particularly compact. In addition, the laser diode is particularly safe since the risk of tilting or detachment of the optical element is reduced. This makes the laser diode particularly eye safe.

According to at least one embodiment, the optical element is in direct contact with a surface of the surface-emitting semiconductor laser facing the optical element. For example, the entire surface of the optical element facing the surface-emitting semiconductor laser is in direct physical contact with a surface of the semiconductor laser. For example, the optical element and the semiconductor laser are mechanically connected to each other by means of a bonding process such as direct bonding. In particular, the semiconductor laser completely covers the surface of the optical element facing the semiconductor laser. Advantageously, the direct arrangement of the optical element on the semiconductor laser enables a particularly compact design of the laser diode.

According to at least one embodiment of the laser diode, the optical element and the semiconductor laser are cohesively connected by a connection means. For example, the connection means is an adhesive. In particular, the connection means is an epoxy resin or silicone. For example, the connection means is transparent to the electromagnetic radiation generated in the semiconductor laser. For example, the connection means is arranged over the entire surface of the optical element facing the semiconductor laser. Advantageously, the use of a connection means to connect the optical element and the semiconductor laser enables a particularly reliable mechanical connection. This reduces the risk of detachment of the optical element from the semiconductor laser.

According to at least one embodiment, the connection means surrounds the semiconductor laser and the optical element in lateral directions. For example, the connection means forms a cladding body in which the optical element and the semiconductor laser are at least partially encapsulated, injected or the like. For example, the optical element and the semiconductor laser are completely surrounded by the connection means in lateral directions. Lateral directions are directions that are transverse or perpendicular to the radiation direction of the semiconductor laser. In particular, the semiconductor laser is only free of the connection means on one side facing away from the optical element. Alternatively, the semiconductor laser and the optical element can be directly cohesively connected to each other. In this case, the optical element can only be free of the connection means on a side facing away from the semiconductor laser. In particular, the optical element is completely surrounded on all sides by the connection means. Advantageously, the surrounding of the semiconductor laser and the optical element by means of the connection means enables a particularly robust design of the laser diode.

According to at least one embodiment of the laser diode, the optical element is formed with a material which—within the manufacturing tolerance—has the same refractive index as the connection means. "Within the manufacturing tolerance" means that the refractive indices differ by no more than 10%, preferably by no more than 5%, in particular by no more than 1%. In particular, at an interface between the connection means and the optical element, the electromagnetic radiation emitted by the semiconductor laser is not refracted or is hardly refracted at all. For example, the connection means has a refractive index of approximately 1.5 and the optical element is formed at least at the interface to the connection means with a material having a refractive index of approximately 1.5. Advantageously, an efficiency loss due to reflections at the interface between the connection means and the optical element is thus reduced.

According to at least one embodiment of the laser diode, the semiconductor laser and/or the optical element are/is laterally enclosed by a cladding. In plan view, the semiconductor laser and the optical element can remain uncovered by the cladding. In particular, the cladding is configured to reflect or absorb the electromagnetic radiation emitted during operation of the semiconductor laser. Along the vertical direction, the cladding has a vertical height which is smaller than the sum of a vertical height of the semiconductor laser and a vertical height of the optical element. In particular, the vertical height of the cladding is less than the sum of the vertical heights of the semiconductor laser, the optical element and the portion of the connection means disposed between the optical element and the semiconductor laser.

According to at least one embodiment of the laser diode, the cladding is formed from a material which is or acts as a radiation absorber or reflector at least for visible light and/or for light in the infrared spectral range. The cladding can completely enclose the semiconductor laser and the optical element laterally. In particular, the cladding partially covers side surfaces of the optical element such that the side surfaces of the optical element essentially remain uncovered by the cladding at least from a vertical height or at least from an upper edge of the diffractive structure or the meta-optical structure or the lens structure. Below the vertical height or the upper edge up to the semiconductor laser, the side surfaces of the optical element, the connection means and/or the semiconductor laser may be completely covered by the material of the cladding. For example, the cladding completely covers the side surfaces of the semiconductor laser. In particular, the laser diode is a component with an integrated semiconductor laser and an integrated optical element.

A vertical height of the diffractive structure or the meta-optical structure or the lens structure is in doubt the vertical position of the substructures of the diffractive structure, the meta-optical structure or the lens structure. The upper edge of the diffractive structure, the meta-optical structure or the lens structure is in particular a surface of the diffractive structure, the meta-optical structure or the lens structure or their substructures facing away from the semiconductor laser. The upper edge can be formed by the surfaces of the optical substructure facing away from the semiconductor laser or the optical substructures of the diffractive structure, the meta-optical structure or the lens structure. The upper edge is not necessarily formed by an outer surface of the optical element. Alternatively, the upper edge may be formed by an outer surface of the optical element facing away from the semiconductor laser.

According to at least one embodiment of the laser diode, the semiconductor laser and the optical element are covered in plan view by a cover layer transmissive for radiation. For example, the cover layer adjoins the cladding, especially directly adjoins the cladding. In particular, the cladding completely covers the side surfaces of the semiconductor laser. The side surfaces of the optical element can be at least partially or completely covered by the cladding.

The cover layer is preferably made of a material that is radiolucent for a large part of the light emitted by the semiconductor laser. The major portion of the light emitted by the semiconductor laser is in particular the radiation portion with a simple standard deviation around the peak wavelength of the light emitted by the semiconductor laser.

For example, the cover layer is made of a material that is transparent to visible light and/or electromagnetic radiation in the infrared spectral range. For example, the cover layer is formed with an epoxy material or silicone, preferably a clear-sighted material. However, it is possible that the material is selected in such a way that the cover layer is radiation-impermeable to visible light and transmissive, in particular transparent, to electromagnetic radiation in the infrared spectral range. For example, the semiconductor laser is configured such that it emits electromagnetic radiation with a peak wavelength in the infrared spectral range during operation.

According to at least one embodiment of the laser diode, the cladding is formed of a material which is or acts radiation-impermeable, preferably radiation-absorbing, to a major part of the light emitted by the semiconductor laser. In this sense, the cladding is in particular made of a black, especially absorbent material. If the material of the cladding is impermeable to visible light, the cladding can produce a black color impression for the human eye under normal light illumination. The cladding is preferably configured to be impermeable to radiation. This can be achieved by selecting the appropriate material and adjusting the thickness of the cladding.

The radiation-impermeable cladding ensures that the electromagnetic radiation emitted by the semiconductor laser does not exit the laser diode from a side surface before it hits the diffractive structure, the meta-optical structure or the lens structure. The laser diode can therefore be designed to be particularly eye-safe. The risk of crosstalk can be reduced or minimized. In addition, an increased contrast is achieved at a radiation exit surface of the laser diode. The peak wavelength of the radiation emitted by the semiconductor laser is preferably a wavelength in the infrared or visible spectral range.

According to at least one embodiment of the laser diode, the cladding is made of a radiation-impermeable material. Preferably, the cladding is, in particular with regard to the choice of material and its layer thickness, designed in such a way that the cladding is radiation-impermeable to light in the infrared spectral range. A material and a layer thickness of the cover layer can be selected such that the cover layer is radiation-impermeable for light in the visible spectral range and radiation-permeable for light in the infrared spectral range. For example, the cladding is made of a material that is or acts radiation-impermeable to light in the infrared spectral range, preferably radiation-absorbing. In particular, the cover layer is made of a material that is or acts radiation-absorbing for light in the visible spectral range and radiation-transmissive for light in the infrared spectral range.

According to at least one embodiment of the laser diode, the laser diode comprises a mask. The mask is formed in a vertical direction between the optical element and the semiconductor laser. The mask is preferably configured to generate a pictogram. For example, the mask is a shading mask with regions transmissive for radiation and regions not transmissive for radiation. In particular, the regions transmissive and/or not transmissive for radiation form a predetermined pattern which, for example, represents a predefined pictogram. During operation of the laser diode, the pictogram can be projected onto a target surface. The optical element allows the pattern of the mask to be enlarged as a pictogram on the target surface. The pictogram can be reproduced by illuminated or non-illuminated parts of the target surface.

According to at least one embodiment of the laser diode, the laser diode comprises a spacer. The spacer is arranged vertically between the optical element and the semiconductor laser. The spacer is preferably configured to set a predetermined distance between the mask and the semiconductor laser. In addition, the spacer may be arranged to set a predetermined distance between the optical element and the semiconductor laser or between the optical element and the mask. Preferably, the spacer is designed to be transparent to the radiation emitted by the semiconductor laser. For example, the spacer has a vertical layer thickness, particularly between 50 μm and 1 mm inclusive, approximately between 50 μm and 500 μm inclusive, or between 100 μm and 500 μm inclusive.

The mask may be formed on the optical element or on the spacer, in particular directly. It is possible that the mask is formed as part of the optical element or as part of the spacer. In particular, the semiconductor laser, the spacer, the optical element and/or the mask are cohesively connected to each other.

According to at least one embodiment of the laser diode, a region between the optical element and the semiconductor laser is filled with non-gaseous material. In particular, no gaseous material is arranged between the semiconductor laser and the optical element. For example, there is no air gap, pore and/or other structure between the optical element and the semiconductor laser filled with a gaseous material. In particular, there is no nitrogen, ambient air, argon and/or other noble gas between the semiconductor laser and the optical element. In particular, only material having a refractive index of at least 1.1, preferably at least 1.3, is arranged between the optical element and the semiconductor laser. Advantageously, a laser beam emitted by the semiconductor laser has a smaller beam widening when passing exclusively through materials having a refractive index greater than 1. Thus, the optical element can advantageously be particularly compact, since only a small beam widening takes place between the surface of the semiconductor laser facing the optical element and the optical element.

According to at least one embodiment, the optical element does not completely cover the surface of the semiconductor laser facing the optical element. For example, the optical element only covers that part of the surface facing the optical element through which the semiconductor laser emits coherent radiation during normal operation. In particular, the optical element covers a maximum of 90%, preferably a maximum of 60%, of the area of the semiconductor laser facing the optical element. In plan view of the laser diode, the optical element has in particular a smaller cross-section than the semiconductor laser. In particular, the optical element does not project beyond the surface of the semiconductor laser facing the optical element in lateral directions, parallel to the main extension of the optical element. Advantageously the optical element can be realized in a particularly space-saving way, so that a particularly small amount of the material of the optical element is required for the production of the optical element.

According to at least one embodiment of the laser diode, the optical element terminates flush with the semiconductor laser in lateral directions. Lateral directions run parallel to the main extension planes of the optical element. In particular, the side surfaces of the semiconductor laser connecting the side facing the optical element and the side facing away from the optical element are parallel to the side surfaces of the optical element connecting the surface facing the semiconductor laser with the surface facing away from the semiconductor laser. For example, the side surfaces of the optical element and the side surfaces of the semiconductor laser are produced in a common process step. Advantageously, a flush termination of the semiconductor laser and the optical element in lateral directions enables a particularly stable connection between the semiconductor laser and the optical element, since, for example, the entire surface of the semiconductor laser facing the optical element is used to produce the mechanically fixed connection. In addition, flush termination in the lateral direction of the optical element and the semiconductor laser enables a particularly compact design of the laser diode.

According to at least one embodiment of the laser diode, the diffractive structure or the meta-optical structure or the lens structure is arranged at a distance from the surface of the semiconductor laser facing the optical element. For example, a side of the optical element facing the semiconductor laser may be formed with a first layer and a side of the optical element facing away from the semiconductor chip may be formed with a second layer. For example, an interface between the first and second layers of the optical element has a structuring with which the elements of the diffractive structure are formed. The first and second layers may each have a main extension plane parallel to the main extension plane of the optical element and/or semiconductor laser. The first and second layers may be formed by materials with different optical properties. For example, the optical properties can be different refractive indices, different absorption coefficients and/or different reflectivity. For example, the first layer may comprise recesses filled with the material of the second layer. In particular, the second layer is formed with several non-contiguous regions which are completely surrounded by the material of the first layer in lateral directions, especially in all directions.

The diffractive structure or the meta-optical structure or the lens structure can be arranged on a side of the first layer facing away from the semiconductor laser. For example, the first layer has a predetermined thickness, which is greater than 0. In particular, the thickness of the first layer is at least 200 μm. Furthermore, between the diffractive structure and the semiconductor laser, or between the lens structure and the semiconductor laser, or between the meta-optical structure and the semiconductor laser, there may be arranged a connection means which, for example, has a thickness of at least 100 μm, in particular at least 200 μm. The connection means forms in particular a connecting layer. For example, the distance between the diffractive structure or the meta-optical structure or the lens structure and the side of the semiconductor laser facing the optical element is at least 25 μm, in particular at least 250 μm. For example, the diffractive structure or the meta-optical structure or the lens structure is arranged at a distance from the surface of the semiconductor laser facing the optical element of at least the thickness of the first layer and/or the connection means. For example, the first layer is made of glass or a glass-like material.

Furthermore, the diffractive structure or the meta-optical structure or the lens structure can be arranged on a side of the optical element facing the semiconductor laser. For example, the diffractive structure or the meta-optical structure or the lens structure is arranged at a distance from the surface of the semiconductor laser facing the optical element of the thickness of the connection means arranged between the semiconductor laser and the optical element. In particular, the diffractive structure or the meta-optical structure or the lens structure is arranged at the interface between the optical element and the connection means. For example, the diffractive structure is formed by structuring the surface of the optical element facing the connection means.

Advantageously, the distance of the diffractive structure or the meta-optical structure or the lens structure to the radiation exit surface of the semiconductor laser facing the optical element can be adjusted particularly precisely by adapting individual layers of the connection means and/or the optical element.

According to at least one embodiment of the laser diode, the vertical distance between the diffractive structure or the meta-optical structure or the lens structure and the connection means or the side of the semiconductor laser facing the optical element is covered, in particular completely covered, by the cladding. The distance may be greater than 50 μm, 100 μm, 200 μm or greater than 300 μm, for example, between 50 μm and 950 μm inclusive, approximately between 100 μm and 500 μm inclusive. For example, the distance is given by a vertical portion of a base body of the optical element, wherein the portion is free of substructures of the diffractive structure or the meta-optical structure or the lens structure. Above the vertical part, i.e., further away from the semiconductor laser, the substructures of the diffractive structure or the meta-optical structure or the lens structure can be formed or embedded in the base body. For example, the portion or the base body of the optical element is a glass body. It is possible that the entire side surfaces of the base body or optical element are covered by the cladding material.

According to at least one embodiment, an anti-reflection layer is arranged exclusively on an outwardly exposed surface of the optical element. For example, the optical element is arranged in direct contact with a surface of the semiconductor laser facing the optical element, or the optical element is arranged on the semiconductor laser by means of a connection means, wherein the refractive index of the connection means deviates by a maximum of 0.2, preferably by a maximum of 0.1, from the refractive index of the material of the side of the optical element facing the semiconductor laser. Advantageously, no additional antireflection coating is necessary on the side of the optical element facing the semiconductor chip, since reflections are avoided at this interface of the optical element due to the small difference between the refractive indices of the optical element and the connection means.

According to at least one embodiment, an electrical contact surface is arranged on the surface of the semiconductor laser facing the optical element and the contact surface is not covered by the optical element. For example, the optical element does not completely cover the surface of the semiconductor laser facing the optical element. Thus, the optical element can be arranged directly on the semiconductor laser and structures of the semiconductor laser which are placed on a side facing the optical element are not covered by the optical element. For example, the contact surface is configured to electrically contact the semiconductor laser and supply it with current. The contact surface, for example, is formed by a metal layer. Advantageously, the optical element can also be arranged directly on the radiation exit surface of the semiconductor laser if the semiconductor laser has functional structures on a side facing the optical element.

According to at least one embodiment, the semiconductor laser comprises electrical contact surfaces exclusively on a side facing away from the optical element. For example, all surfaces of the semiconductor laser, with the exception of the surface on which the electrical contact surfaces are arranged, are completely covered by a connection means. Advantageously, such a design enables a particularly robust and compact laser diode.

In addition, a method of manufacturing a laser diode is specified. In particular, a laser diode described here can be manufactured using this method. This means that all features disclosed for the laser diode are also disclosed for the method and vice versa.

According to at least one embodiment, the method of manufacturing a laser diode comprises a method step A in which a plurality of surface emitting semiconductor lasers are provided in a first composite. For example, the plurality of surface emitting semiconductor lasers is manufactured in a common process. In particular, the entire composite of the plurality of surface emitting semiconductor lasers is manufactured in a common process. For example, the plurality of surface emitting semiconductor lasers in the first composite are arranged on a common carrier. In particular, the plurality of semiconductor lasers is manufactured on the carrier. For example, the plurality of surface emitting semiconductor lasers is arranged in a lateral plane side by side. In particular, the plurality of surface-emitting semiconductor lasers is arranged side by side at the nodes of a regular rectangular grid. For example, the first composite is a wafer composite in which the laser diodes are manufactured together.

According to at least one embodiment of the method of manufacturing a laser diode, a plurality of optical elements are provided in a second composite in method step B. For example, the plurality of optical elements is manufactured in a common process. The plurality of optical elements is, for example, arranged side by side in a lateral plane. In particular, the plurality of optical elements is arranged side by side in a lateral plane at the nodes of a regular rectangular grid.

According to at least one embodiment of the method of manufacturing a laser diode, the plurality of optical elements and the plurality of semiconductor lasers are cohesively connected in a method step C. For example, the optical elements and the semiconductor lasers are connected to each other by means of a connection means. Alternatively, the optical elements and the semiconductor lasers can be bonded together. In particular, all semiconductor lasers and all optical elements are connected simultaneously in a common method step.

According to at least one embodiment of the method of manufacturing a laser diode, the optical elements and the semiconductor lasers are singulated in a method step D, wherein exactly one optical element being assigned to each semiconductor laser after singulation. For example, the optical elements and the semiconductor lasers are singulated in a common process step. For example, the optical elements and the semiconductor lasers are singulated by sawing, a laser cutting process or an etching process.

Advantageously, such a method allows a simultaneous arrangement of a plurality of optical elements on a plurality of semiconductor lasers, whereby both the optical elements and the semiconductor lasers can be manufactured in a common process.

According to at least one embodiment of the method of manufacturing a laser diode, method step D is carried out after method step C. In particular, the optical elements and the semiconductor lasers are singulated after the optical elements have been cohesively connected to the semiconductor lasers. In particular, method steps A, B, C and D are carried out in this sequence. Advantageously, such a procedure makes it possible to simplify the alignment of the optical element 20 relative to the semiconductor laser 10. Furthermore, this enables a particularly time-saving production of a plurality of light-emitting diodes.

According to at least one embodiment of the method of manufacturing a laser diode, a laser diode described here is manufactured.

BRIEF DESCRIPTION OF THE DRAWINGS

Advantageous embodiments and developments of the laser diode and the method of manufacturing a laser diode will become apparent from the exemplary embodiments described below in association with the figures:

FIGS. 4, 5A, 5B, 5C and 5D show different methods steps of the method of manufacturing a laser diode;

DETAILED DESCRIPTION OF ILLUSTRATIVE EMBODIMENTS

In the exemplary embodiments and figures, similar and similarly acting constituent parts are provided with the same reference symbols. The elements illustrated in the figures and their size relationship among one another should not be regarded as true to scale. Rather, individual elements may be represented with an exaggerated size for the sake of better representability and/or for the sake of better understanding.

Figure 1:
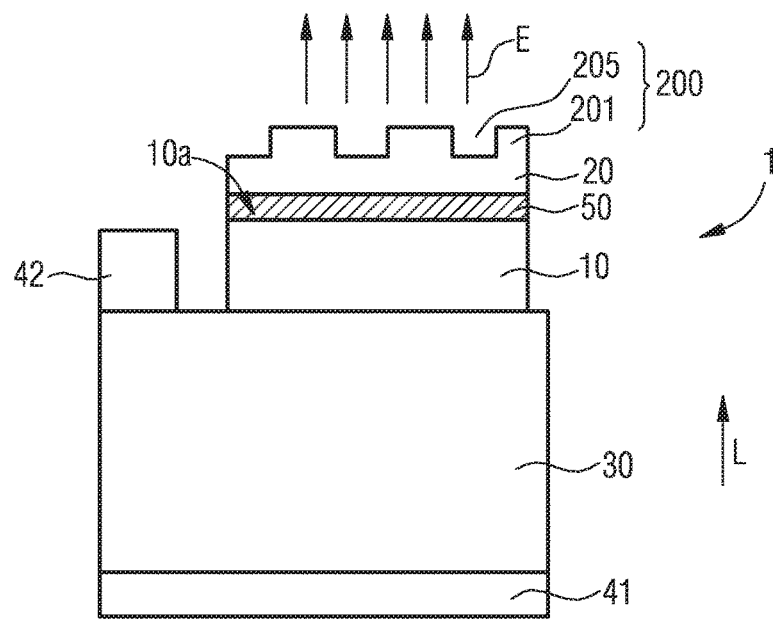
FIGS. 1, 2, 3 and 5D show different exemplary embodiments of a laser diode.

FIG. 1 shows a schematic sectional view of a laser diode 1 described here according to a first exemplary embodiment. The laser diode comprises a surface-emitting semiconductor laser 10, which is configured to emit electromagnetic radiation E. In particular, the semiconductor laser 10 is configured to emit electromagnetic radiation E perpendicular to its main extension plane. In particular, the semiconductor laser 10 is a VCSEL. For example, the semiconductor laser 10 is formed with a layer stack comprising several semiconductor layers. During normal operation, the semiconductor laser emits electromagnetic radiation E from the semiconductor layers in a radiation direction L that is parallel to the stacking direction, for example.

Further, the laser diode 1 comprises a carrier 30 arranged on a major surface of the semiconductor laser 10. For example, the carrier 30 is a substrate on which the semiconductor laser 10 is manufactured. In particular, the semiconductor laser 10 is manufactured by means of an epitaxial process on the carrier 30. An optical element 20 is arranged on one side of the semiconductor laser 10 facing away from the carrier 30. The optical element 20 is arranged downstream of the semiconductor laser 10 in the radiation direction L. The optical element 20 comprises a diffractive structure 200 or a meta-optical structure 200 or a lens structure 200 which is configured to influence electromagnetic radiation E emitted by the semiconductor laser 10. For example, the diffractive structure 200 comprises elements 205 arranged periodically along the main plane of extension of the optical element 20, which in at least one spatial direction transverse to the emission direction L have a magnitude in the order of the wavelength range of the emitted electromagnetic radiation E. For example, the optical elements 205 are formed as recesses in a first layer 201 of the optical element 20. In particular, the recesses with which the elements 205 are formed may be filled with a gaseous material. The elements 205, which are shown schematically in FIG. 2, form substructures of the diffractive structure 200 or the meta-optical structure 200 or the lens structure 200.

The semiconductor laser 10 and the optical element 20 are mechanically fixed to each other by means of a connection means 50. For example, the connection means 50 is an adhesive, in particular an epoxy resin or a silicone. The connection means 50 is arranged on a radiation exit surface 10a of the laser diode 10. The connection means 50 forms in particular a connecting layer 50. The connecting layer 50 is arranged in a vertical direction, for example, between the optical element 20 and the semiconductor laser 10. For example, a region between the optical element 20 and the semiconductor laser 10 is filled with non-gaseous material. In particular, the connection means 50 completely covers the radiation exit surface 10a. The optical element 20, in particular the first layer 201, is formed, for example, with a material having the same refractive index as the connection means 50.

A first contact surface 41 and a second contact surface 42 are arranged on the carrier 30. By means of the first contact surface 41 and the second contact surface 42, the laser diode 1 can be electrically contacted and operated. The first contact surface 41 is located on a side of the carrier 30 facing away from the semiconductor laser 10. For example, the side of the carrier 30 facing away from the semiconductor laser 10 is completely covered by the first contact surface 41. The laser diode 1 can be mounted with the first contact surface 41 on an electrically conductive surface, which can also serve as a heat sink for the laser diode 1. The second contact surface 42 is arranged on one side of the carrier 30, facing away from the first contact surface 41, laterally next to the semiconductor laser 10. For example, the second contact surface 42 can be electrically contacted by means of a bonding wire 43.

Figure 2:
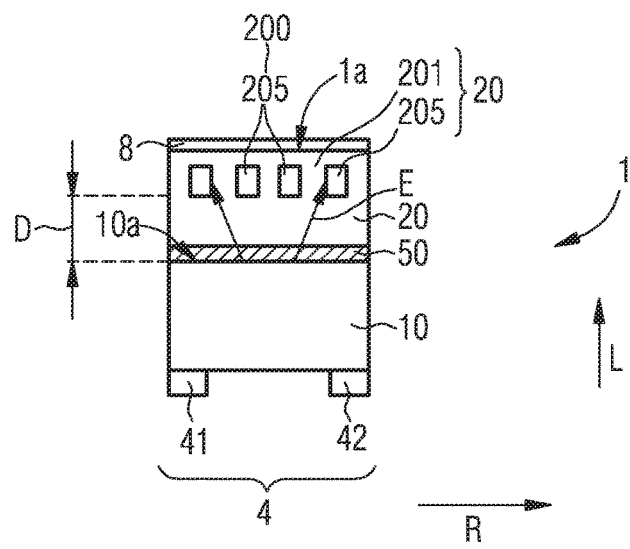

FIG. 2 shows a schematic sectional view of a laser diode 1 described here according to another exemplary embodiment. In contrast to the exemplary embodiment shown in FIG. 1, the semiconductor laser 10 is not arranged on a carrier 30. In particular, the semiconductor laser 10 comprises electrical contact surfaces 4 exclusively on a side facing away from the optical element 20. The semiconductor laser 10 and the optical element 20 are cohesively connected to each other by a connection means 50. For example, the optical element 20 is formed with a material which has the same refractive index as the connection means 50. In particular, the electromagnetic radiation E emitted by the semiconductor laser 10 is not refracted at the interface between the connection means 50 and the optical element 20.

The optical element 20 terminates flush with the semiconductor laser 10 in lateral directions R which are perpendicular to the radiation direction L of the semiconductor laser 10. In particular, the optical element 20 does not project beyond the semiconductor laser 10 in lateral directions R. The optical element 20 is formed by a first layer 201 and a second layer 202. The second layer 202 is not contiguous and is arranged in recesses of the first layer 201. For example, the second layer 202 is completely surrounded on all sides by the first layer 201. The first 201 and the second 202 layer form elements 205 which act as a diffractive structure 200 for the electromagnetic radiation E emitted by the semiconductor laser 10.

It is possible that the elements 205 are formed by substructures of the meta-optical structure 200 or the lens structure 200. The substructures of the meta-optic structure 200 or the lens structure 200 can be completely surrounded on all sides by the first layer 201. Especially in this sense the diffractive structure 200 or the meta-optic structure 200 or the lens structure 200 is embedded in the optical element 20, especially in the first layer 201. The first layer 201 serves in particular as a planarization layer and/or as an encapsulation layer of the optical element 20. Deviating from FIG. 2, it is possible that several or all elements 205, which are formed in particular by substructures of the meta-optical structure 200 or the lens structure 200, are formed contiguously. For example, the elements 205 form a lens row, a lens matrix from several lens rows of the lens structure 200 or a meta lens, in particular from nanosubstructures of the meta-optic structure 200.

The diffractive structure 200, the meta-optical structure 200 or the lens structure 200 is arranged at a distance from the side 10a of the semiconductor laser 10 facing the optical element. In particular, the distance D between the diffractive structure 200, the meta-optical structure 200 or the lens structure 200 and the radiation exit surface 10a can be adapted via the thickness of the connection means 50 and/or the thickness of the optical element 20, in particular the first layer 201.

If the optical element 20 comprises a lens structure 200, the element 205 can be formed as a lens. In particular, element 205 forms an optical substructure of the lens structure 200. The majority of elements 205 may form one or more rows of lenses. The elements 205 can be embedded in the first layer 201. The elements 205 may have a higher or lower refractive index than a material of the first layer 201. For example the refractive indices of the elements 205 and the material of the first layer 201 differ by at least 0.1, 0.2, 0.5 or by at least 0.5, for example between 0.1 and 1 inclusive or between 0.1 and 2 inclusive. The first layer 201 may be formed as a planarization layer or as an encapsulation layer of the diffractive structure 200, the meta-optical structure 200, the lens structure 200 or the optical element 20.

Furthermore, an anti-reflection layer 8 is arranged on a surface of the optical element 20 facing away from the semiconductor laser 10. In particular, the anti-reflection layer 8 is arranged exclusively on an outwardly exposed surface 1a of the optical element 20.

Figure 3:
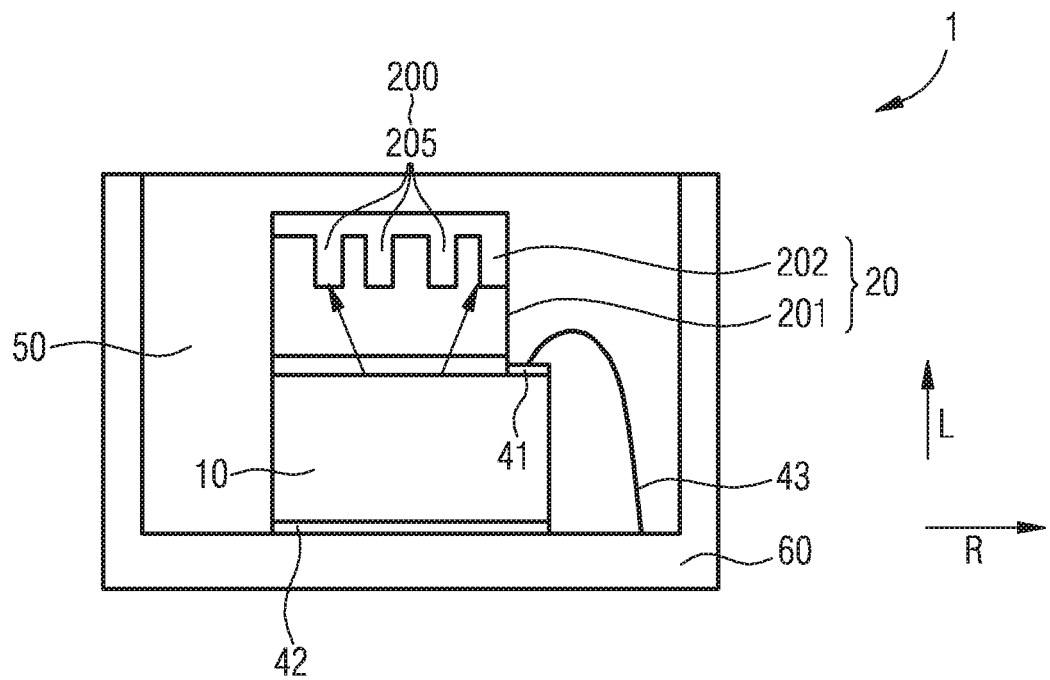

FIG. 3 shows a schematic sectional view of a laser diode 1 described here according to another exemplary embodiment. In this exemplary embodiment, the optical element 20 and the semiconductor laser 10 are cohesively connected to each other by means of the connection means 50. Furthermore, the connection means 50 surrounds the semiconductor laser 10 and the optical element 20 in lateral directions R. In particular, all surfaces of the optical element 20 and the semiconductor laser 10 which run transversely to the radiation direction L of the semiconductor laser 10 are completely covered by the connection means 50. In particular, the connection means 50 also completely covers the surface of the optical element 20 facing away from the semiconductor laser 10. For example, the connection means 50 is a capsulation means which is transparent to the electromagnetic radiation E emitted by the semiconductor laser 10.

The semiconductor laser 10 is cohesively connected to a housing 60 on a side facing away from the optical element 20 by means of the second contact surface 42. For example, the housing 60 is at least partially electrically conductive and serves as a heat sink and for electrical contacting of the semiconductor laser 10. The first contact surface 41 is arranged on the radiation exit surface 10a of the semiconductor laser 10. The first contact surface 41 is electrically conductively connected to the housing 60 by means of a bonding wire 43. In particular, the bonding wire 43 and the second contact surface 42 are not electrically conductively connected to each other via the housing 60. The first electrical contact surface 41 is arranged on the radiation exit surface boa of the semiconductor laser 10 facing the optical element 20. The optical element 20 does not completely cover the radiation exit surface boa of the semiconductor laser 10. In particular, the first contact surface 41 is not covered by the optical element 20.

The optical element 20 is formed by a first layer 201 and a second layer 202. The first layer 201 has a plurality of recesses which are completely filled with the material of the second layer 202. The first 201 and the second 202 differ in at least one optical property, such as their refractive index, their reflectivity and/or their absorption for electromagnetic radiation E emitted by the semiconductor laser 10. The first 201 and the second 202 form a diffractive structure 200 comprising a plurality of elements 205 configured to influence electromagnetic radiation E emitted by the semiconductor laser 10.

According to FIG. 3, the semiconductor laser 10 projects beyond the optical element 20 in a lateral direction. The semiconductor laser 10 can be partially free of a covering by the optical element 20 so that it can be electrically contacted, in particular on its side facing the optical element 20. In plan view, the optical element 20 covers the semiconductor laser 10 only partially. For example, the semiconductor laser 10 has a surface facing the optical element 20 with a free region which is free of a covering by the optical element 20. One or more contact surfaces 41 and/or 42 may be formed on the free region.

Deviating from FIG. 3, it is possible that the optical element 20 shown in FIG. 3 is constructed analogously to the optical element 20 shown in FIG. 2. Deviating from FIG. 3, it is also possible that both the first contact surface 41 and the second contact surface 42 are arranged analogously to the exemplary embodiment of a laser diode 1 shown in FIG. 2 on a rear side of the semiconductor laser 10 facing away from the optical element 20. The semiconductor laser 10 is configured in particular as a surface-mountable component and can only be electrically contacted externally via its rear side. The first contact surface 41 and the second contact surface 42 are particularly assigned to different electrical polarities of the semiconductor laser 10 and the laser diode 1, respectively. For example, the semiconductor laser 10 has the form of a flip chip.

Figure 4:
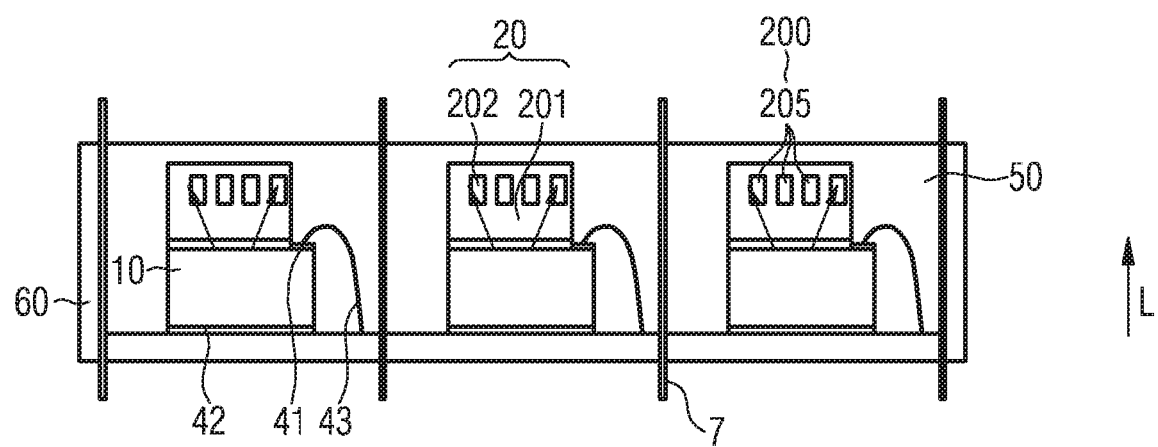

FIG. 4 shows part of a method of manufacturing a plurality of laser diodes 1. In this method step, the semiconductor lasers 10 are cohesively connected to a housing 60 with their second contact surface 42. The semiconductor lasers 10 are electrically conductively connected to the housing 60 by means of a bonding wire 43 at their first contact surface 41. The connection means 50, which serves as a capsulation means, is arranged in the housing 60.

The connection means 50 is arranged at least on the radiation exit surface 10a of the semiconductor laser 10. In addition, the connection means 50 is arranged in the housing 60 such that side surfaces of the semiconductor laser 10, which connect the side of the semiconductor laser 10 facing away from the optical element 20 and the side of the semiconductor laser 10 facing away from the optical element 10a, are covered. The connection means 50, for example, can be arranged in a method step in the housing 60 such that all radiation exit surface 10a of the semiconductor laser 10 are covered with a predetermined thickness of the connection means 50. In a further method step, optical elements 20 can be arranged on the semiconductor lasers 10, so that the optical elements 20 are arranged downstream of the semiconductor lasers 10 in a radiation direction L. In a subsequent method step, additional connection means 50 is arranged in the housing 60 so that the optical elements 20 are completely covered by the connection means 50. In a subsequent method step, the laser diodes 1 are singulated along the separation lines 7. For example, the laser diodes 1 are singulated along the separation lines 7 by means of a sawing or laser cutting process.

Figure 5A:
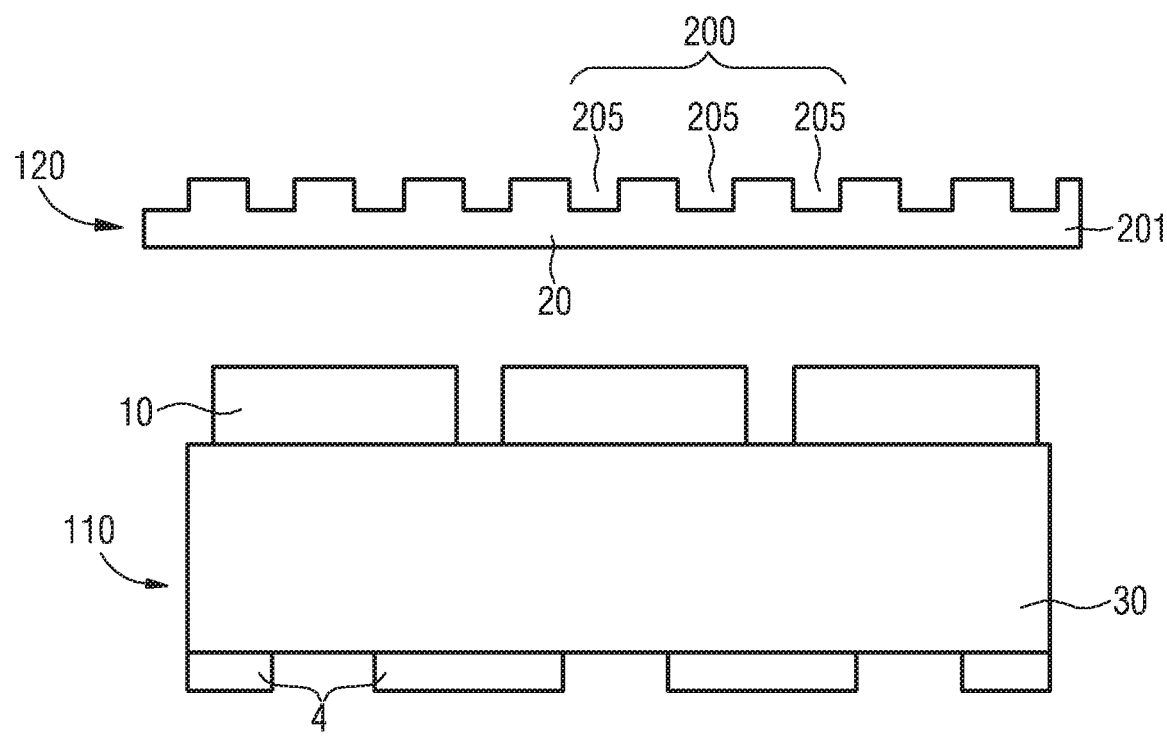

FIG. 5A shows a method described here for the manufacturing of a laser diode 1 after method steps A and B. In method step A, a plurality of surface emitting semiconductor lasers 10 were provided in a first composite 110. For example, the semiconductor lasers 10 are arranged on a common carrier 30. In particular, the semiconductor lasers 10 on the common carrier 30 are manufactured in a common manufacturing process. Contact surfaces 4 are arranged on a side of the carrier 30 facing away from the semiconductor lasers 10.

Furthermore, in a method step B, a plurality of optical elements 20 with diffractive structures 200, meta-optical structures 200 or with lens structures 200 are provided in a second composite 120. The plurality of optical elements 20 is cohesively connected to each other. In particular, the optical elements 20 are manufactured in a common process. The diffractive structures 200, the meta-optical structures 200 or the lens structures 200 are formed with elements 205 which are arranged, for example, on a surface of a first layer 201 of the optical element 20 facing away from the laser diode 10. Alternatively, the diffractive structures 200, the meta-optical structures 200 or the lens structures 200 can be completely surrounded by the material of the first layer 201 of the optical element 20. For example, the diffractive structures 200 or the lens structures 200 can be formed by varying the thickness of the optical element 20.

Figure 5B:
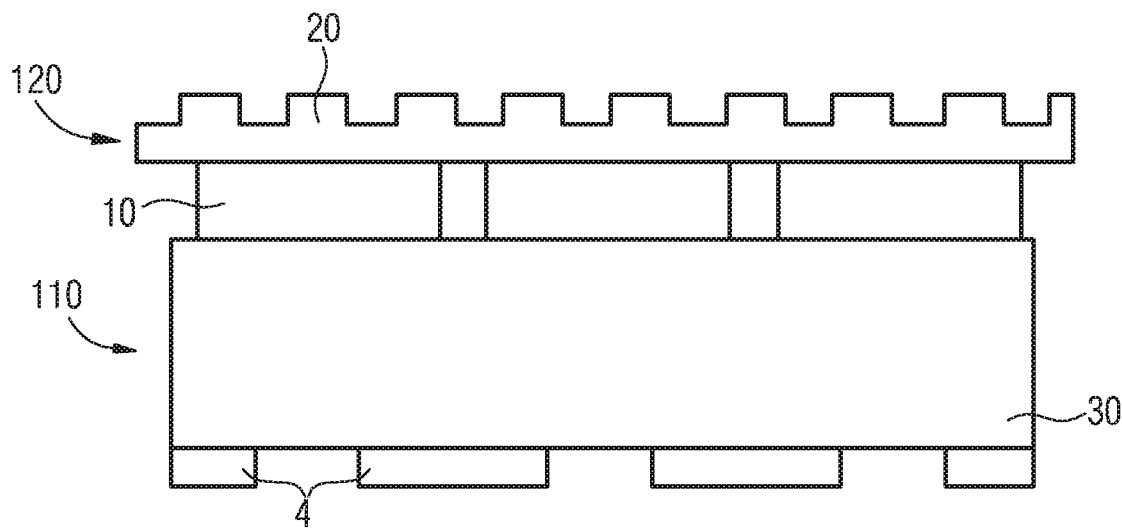

FIG. 5B shows a schematic sectional view of a method described here for the manufacturing of a laser diode after method step C. In method step C, the plurality of optical elements in a composite and the plurality of semiconductor lasers in a composite were cohesively connected to each other. For example, the first composite 110 and the second composite 120 were cohesively connected to each other via bonding. Alternatively, the first bond 110 and the second bond 120 can be cohesively connected to each other by means of a connection means 50.

Figure 5C:
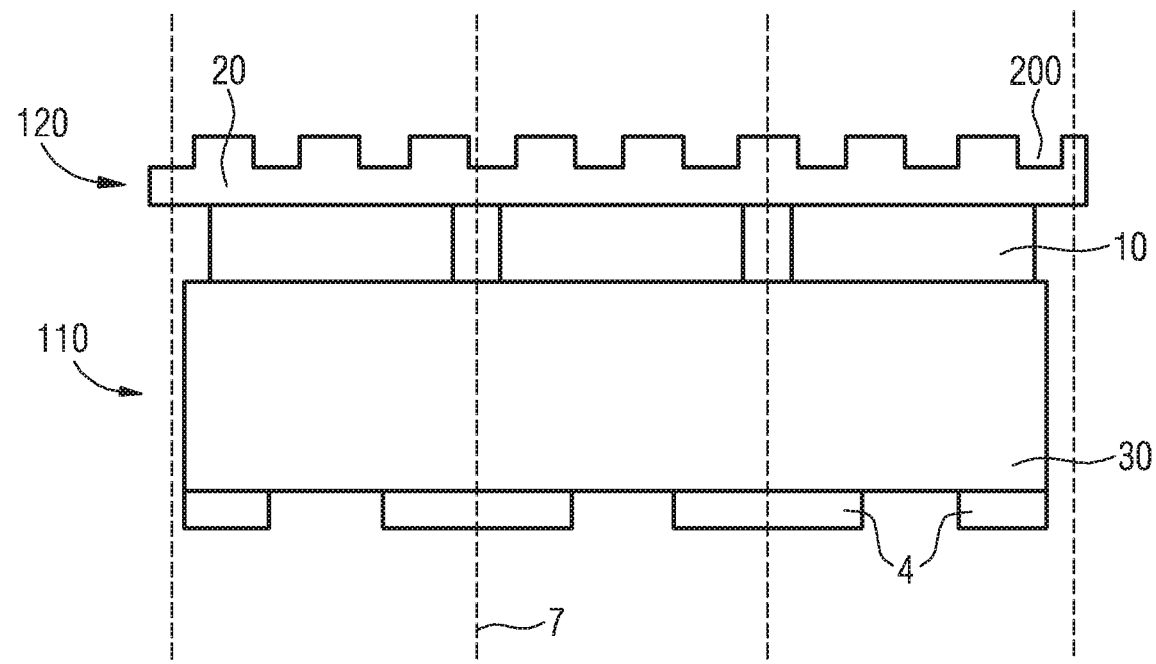

FIG. 5C shows a method step D of a method described here for manufacturing a laser diode 1. In a method step D, the first composite 110 and the second composite 120 are singulated. The optical elements 20 and the semiconductor lasers 10 are cut perpendicular to their main extension plane along the separation line 7. For example, the first composite 110 and the second composite 120 are cut using a laser cutting process, a sawing process or an etching process. After singulation, each semiconductor laser 10 is assigned exactly one optical element 20.

Figure 5D:
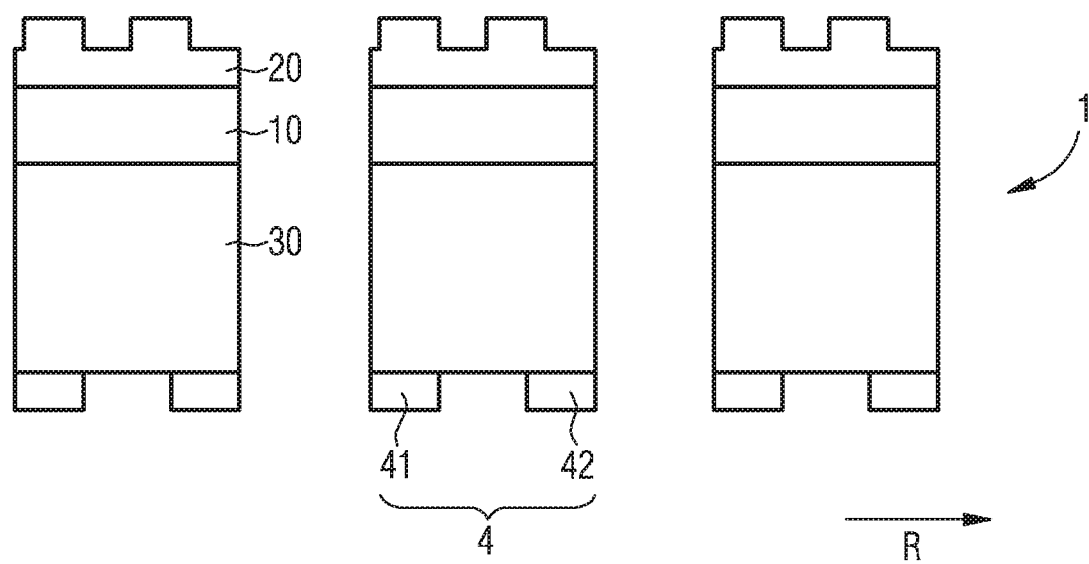

FIG. 5D shows the laser diodes 1 after carrying out method steps A to D according to the method described here for manufacturing a laser diode 1. In particular, the laser diode 1 described here has electrical contact surfaces 4 exclusively on one side facing away from the optical element 20. The semiconductor lasers 10, the contact surfaces 4, the carriers 30 and the optical elements 20 are cut in a common method step. The optical elements 20, the semiconductor lasers 10 and the carriers 30 terminate flush with each other in lateral directions.

Figure 6:
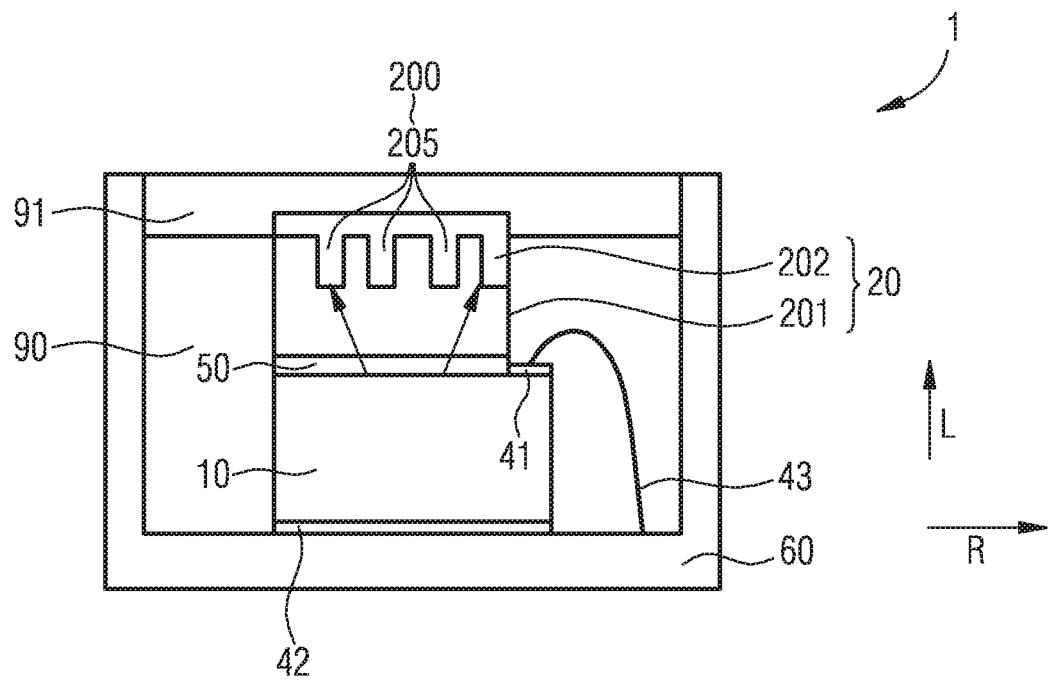
FIGS. 6, 7, 8 and 9 show further exemplary embodiments of a laser diode or a method of manufacturing a laser diode.

The exemplary embodiment shown in FIG. 6 of a laser diode 1 corresponds essentially to the exemplary embodiment shown in FIG. 3. In contrast to this, the connection means 50 is arranged exclusively between the semiconductor laser 10 and the optical element 20. The semiconductor laser 10 and the optical element 20 are completely enclosed in the lateral direction by a cladding 90. For example, the side surfaces of the semiconductor laser 10 and/or the connection means 50 are completely covered by a material of the cladding 90. According to FIG. 6, the side surfaces of the optical element 10 are only partially covered by the cladding material 90, in particular substantially up to the vertical height of the elements 205. However, it is possible that the side faces of the optical element 10 are completely covered by the cladding material 90. In plan view of the optical element, the semiconductor laser 10 or the optical element 10 is preferably free of a covering by the cladding 90.

For the electromagnetic radiation emitted by the semiconductor laser 10, the material of the cladding 90 may be chosen to be not transmissive. For example, the cladding material 90 acts radiation-absorbing or radiation-reflecting. In particular, the cladding is not transmissive for electromagnetic waves with a peak wavelength of the light emitted by the semiconductor laser 10. By covering the side surfaces of the semiconductor chip 10 and/or the optical element 20, it can be prevented that the electromagnetic radiation emitted by the semiconductor laser 10 is emitted laterally from the semiconductor laser 10 or from the optical element 20, before it hits the diffractive structures 200, the meta-optical structures 200 or the lens structures 200.

A layer, such as the cladding 90 or the cover layer 91, is transmissive for radiation if preferably at least 50%, 60%, 70%, 80% or at least 90% of the radiation emitted by the semiconductor laser can be transmitted through this layer. On the other hand, a layer is not transmissive if it transmits not more than 50%, 40%, 30%, 20%, 10% or not more than 5% of the radiation emitted by the semiconductor laser.

According to FIG. 6, the laser diode 1 comprises a cover layer 91. In particular, the cover layer 91 directly adjoins the cladding 90 and/or a surface of the optical element 20 facing away from the semiconductor laser 10 or the anti-reflection layer 8. In plan view, the cover layer 91 can cover the optical element 20, the semiconductor laser 10 and/or the cladding 90, in particular completely. For the electromagnetic radiation emitted by the semiconductor laser 10, the material of the cladding 91 may be transmissive. It is possible that the cover layer 91 is not transmissive to visible light and transmissive to electromagnetic radiation in the infrared range, or vice versa.

In FIG. 6, the housing 60 comprises a cavity in which the cover layer 91, the cladding 90, the optical element 20 and/or the semiconductor laser 10 is/are arranged. Deviating from FIG. 6, it is possible that the housing 60 comprises only a laterally extending region and no vertically extending regions. In this case, the housing 60 does not have a cavity with inner walls from the vertically extending regions, but only a laterally extending region on which the semiconductor laser 10 is arranged. In particular, the laterally extending region is in the form of a carrier, in particular in the form of a printed circuit board, to which the semiconductor laser is electrically conductively connected. Such a laser diode 1 is shown, for example, in FIG. 7. Such a laser diode 1 comprises outer side surfaces which are formed by surfaces of the cladding 90 and/or the cover layer 91. In particular, laser diode 1 is formed as a chip-scale package (CSP) whose lateral and/or vertical expansion is approximately in the same order of magnitude as the lateral and/or vertical expansion of the semiconductor laser 10.

Figure 7:
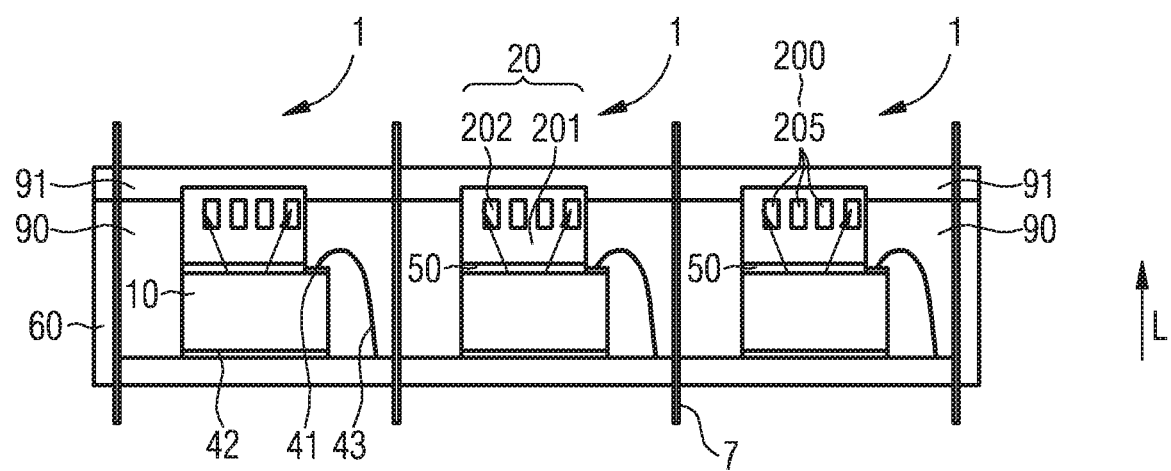

The exemplary embodiment shown in FIG. 7 for a part of a method of manufacturing a plurality of laser diodes 1 essentially corresponds to the exemplary embodiment shown in FIG. 4. In contrast to this, the cladding body or the cladding 90 is made of a material different from a material of the connection means 5, analogous to the exemplary embodiment shown in FIG. 6. For example, the cladding is molded or formed by filling a cavity in which the semiconductor laser 10 or a plurality of semiconductor lasers 10 are arranged. The arrangement of the claddings 90 and/or the cover layer 91 in FIGS. 6 and 7 may be identical. In contrast to FIGS. 6 and 7, the optical element 10 may take other forms described here.

Figure 8:
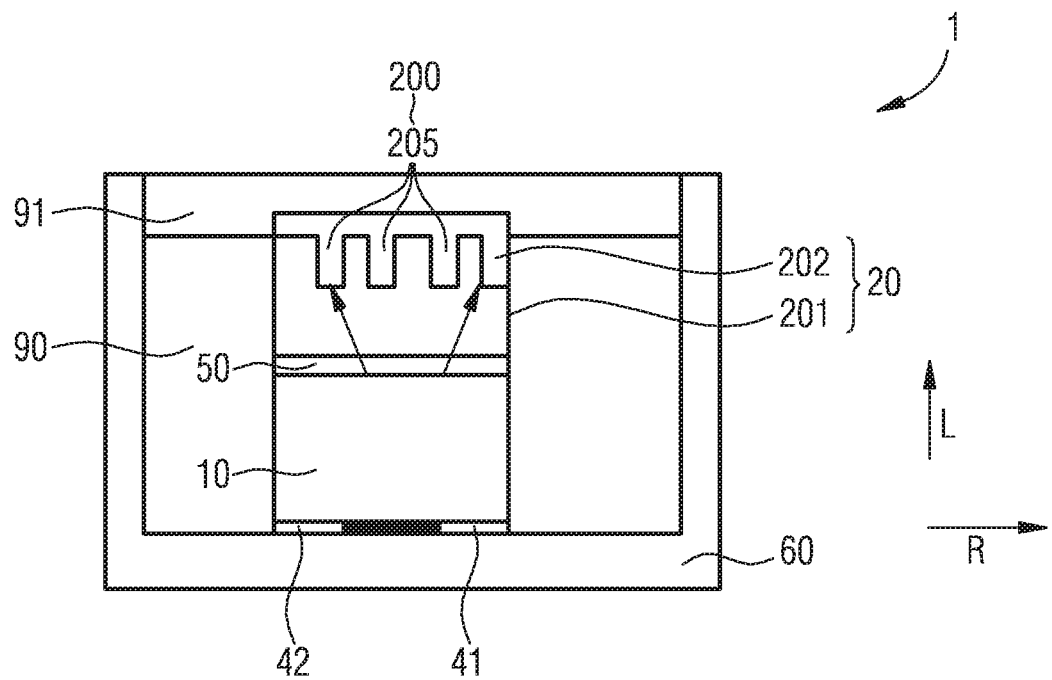

The exemplary embodiment shown in FIG. 8 for a laser diode 1 is essentially the same as the exemplary embodiment shown in FIG. 6 for a laser diode 1. In contrast to this, the semiconductor laser 10 comprises a first contact surface 41 and a second contact surface 42 on a rear side of the semiconductor laser 10 facing away from the optical element 20. The semiconductor laser 10 can therefore only be electrically contacted externally via its rear side.

Figure 9:
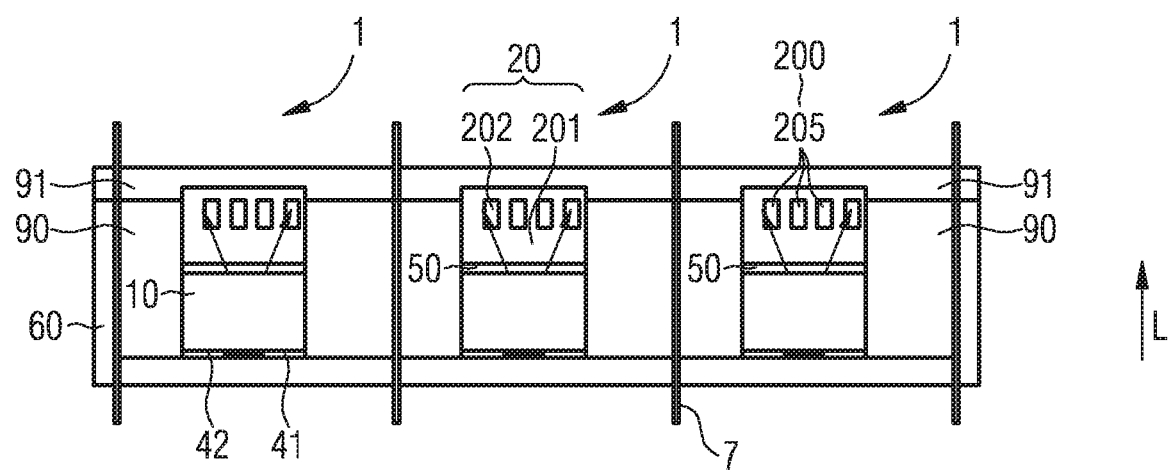

The exemplary embodiment shown in FIG. 9 for a method step of manufacturing a plurality of laser diodes 1 essentially corresponds to the exemplary embodiment shown in FIG. 7. In contrast to this, the semiconductor laser 10 or the semiconductor lasers 10 can be electrically contacted externally, analogous to FIG. 8, exclusively via its rear side(s).

Figure 10A:
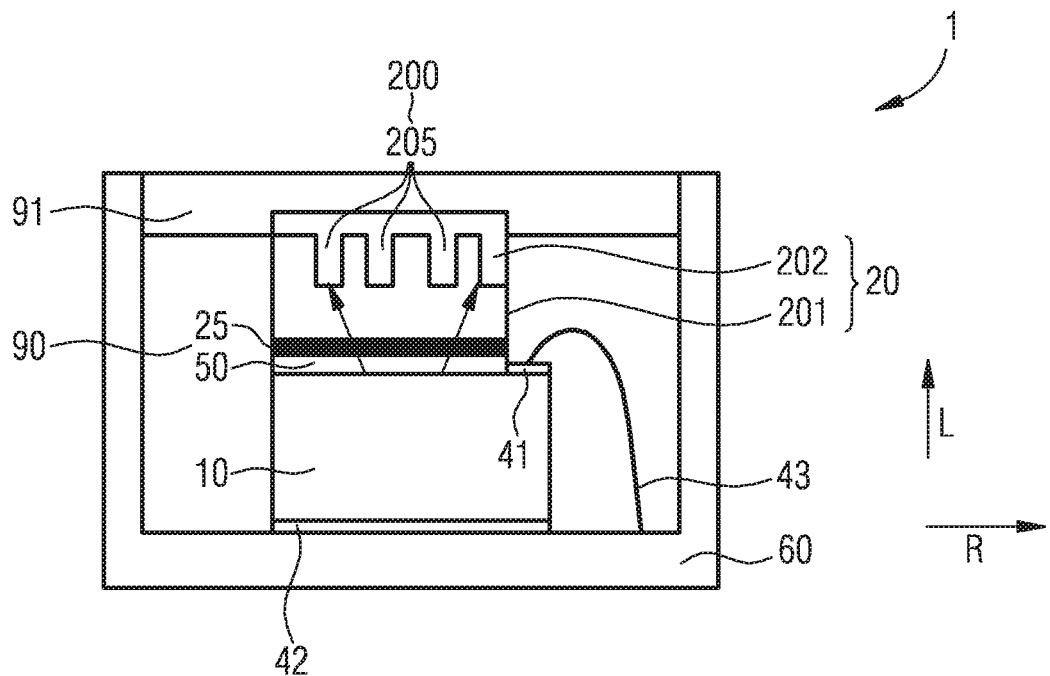
FIGS. 10A, 10B, 10C, 11A and 11B show further exemplary embodiments of a laser diode or a method of manufacturing a laser diode.

The exemplary embodiment shown in FIG. 10A for a laser diode 1 corresponds essentially to the exemplary embodiment shown in FIG. 6 for a laser diode 1. In contrast to this, the laser diode 1 comprises a mask 25. The mask 25 is arranged in vertical direction between the optical element 20 and the semiconductor laser 10. In FIG. 10A, the mask 25 is arranged between the optical element 20 and the connection means 50. In particular, mask 25 is located on the back of optical element 20, i.e., on a surface of optical element 20 facing the semiconductor laser 10. It is possible that mask 25 is applied directly to the optical element 20. The mask 25 can be applied to the optical element by means of a coating or a deposition method, for example by vapor deposition or sputtering.

In particular, the mask 25 is a shadow mask. The mask 25 may comprise patterns which, in particular, form a predefined pictogram. The mask 25 is preferably a mask 25 that forms a pictogram. The mask 25 may comprise regions transmissive for radiation that define the shape of the pictogram to be displayed. Regions that are not transmissive for radiation may be formed by a radiation-absorbing and/or a radiation-reflecting material. For example, the regions not transmissive for radiation of the mask 25 may be formed by a metal or metal alloy.

The mask 25 may comprise regions transmissive for radiation that allow the radiation emitted by the semiconductor laser 10 to pass the mask 25 unhindered or essentially unhindered. The regions transmissive for radiation may be openings or free regions of the mask 25. It is also possible that the regions transmissive for radiation of the mask 25 are formed by a material transmissive for radiation. Due to the regions transmissive for radiation and the regions not transmissive for radiation, the mask can form an arbitrary pattern and thus an arbitrary pictogram. During operation, the particularly compact laser diode 1 with the semiconductor laser 10, the mask 25 and the optical element 20 can project a pictogram onto a target surface without any additional aids.

Figure 10B:
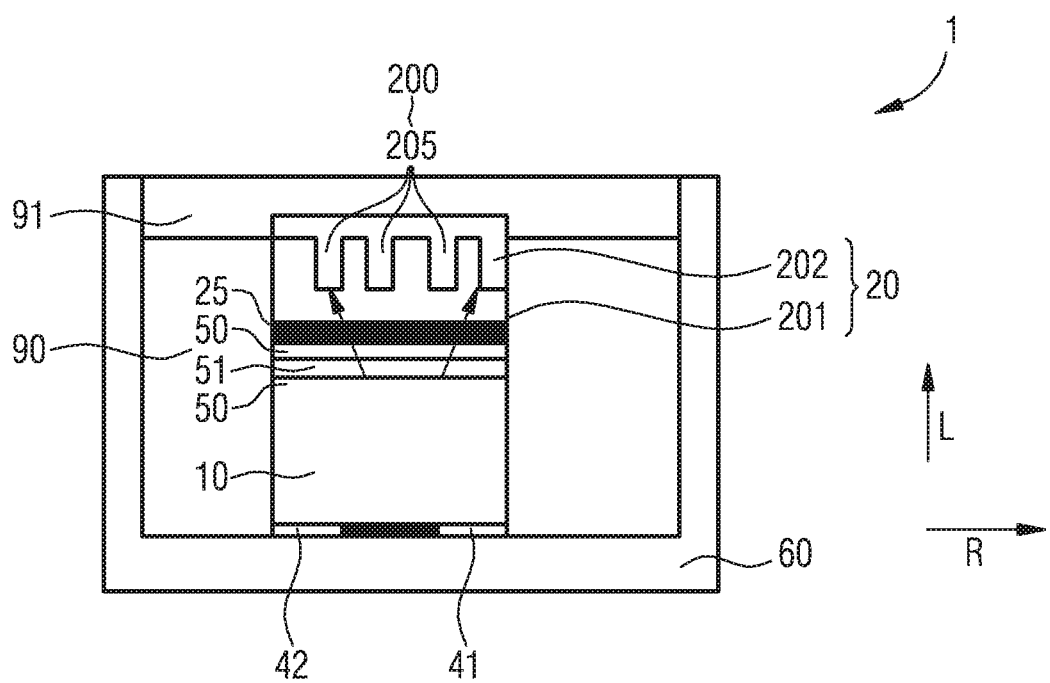

The exemplary embodiment shown in FIG. 10B for a laser diode 1 corresponds essentially to the exemplary embodiment shown in FIG. 8 for a laser diode 1. In contrast to this, the laser diode 1 comprises a mask 25 analogous to the exemplary embodiment shown in FIG. 10A. In contrast to the exemplary embodiment shown in FIG. 10A, the laser diode 1 comprises a spacer 51 as shown in FIG. 10B. The spacer 51 is arranged along a vertical direction between the semiconductor laser 10 and the mask 25. The spacer 51 is preferably transmissive for radiation. For example, the spacer 51 is formed of glass, quartz glass or a glass-like material. The spacer 25 can be used to adjust an ideal distance between the semiconductor laser 10 and the mask 25, so that the mask 25 is optimally, approximately homogeneously, illuminated. According to FIG. 10B, the spacer 25 is arranged between two connecting layers 50 and, in particular, adjoins directly to these connecting layers 50. The semiconductor laser 10 and the mask 25 can each be directly adjacent to one of the two connection layers 50.

Figure 10C:
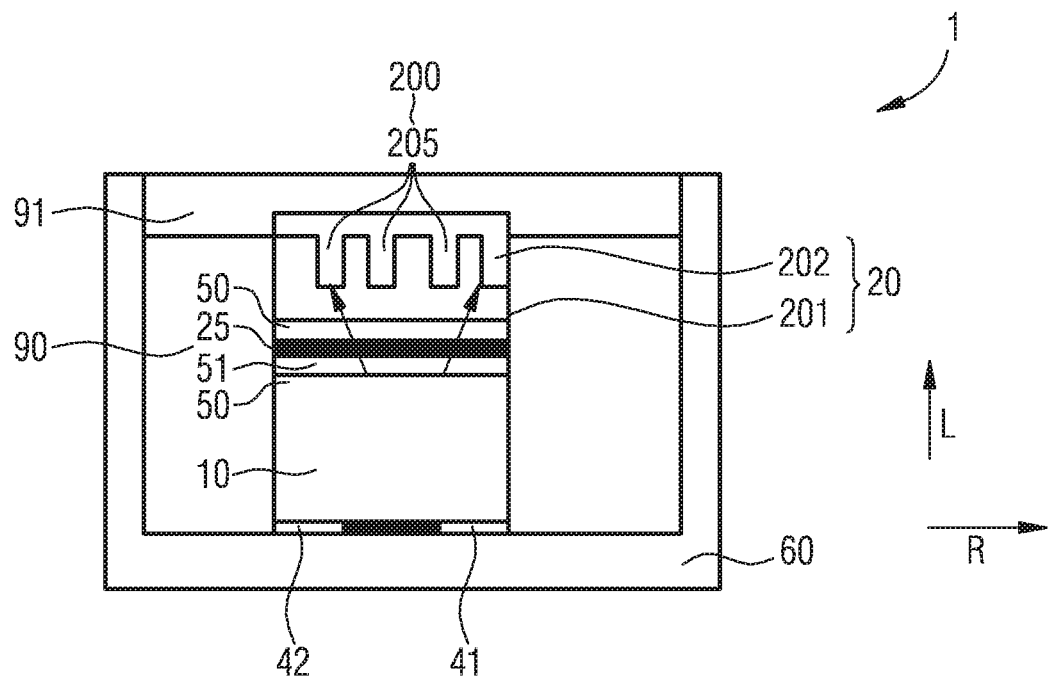

The exemplary embodiment shown in FIG. 10C for a laser diode 1 is essentially the same as the exemplary embodiment shown in FIG. 10B for a laser diode 1. In contrast, the mask 25 is not arranged on the back of the optical element 20 but on a surface of the spacer 51. In this sense the mask 25 is not part of the optical element 20 but part of the spacer 51. While the mask 25 is arranged according to FIG. 10B on the optical element 20 and only mechanically connected to the spacer 51 via the connecting layer 50, the mask 25 according to FIG. 10C is arranged on the spacer 51 and only mechanically connected to the optical element 20 via the connecting layer 50.

The mask 25 is arranged in particular on a surface of the spacer 51 facing away from the semiconductor laser 10. It is possible that the mask 25 is applied directly to the spacer 51. The mask 25 can be applied to the spacer 51 by means of a coating or a deposition process, for example by vapor deposition or sputtering.

Figure 11A:
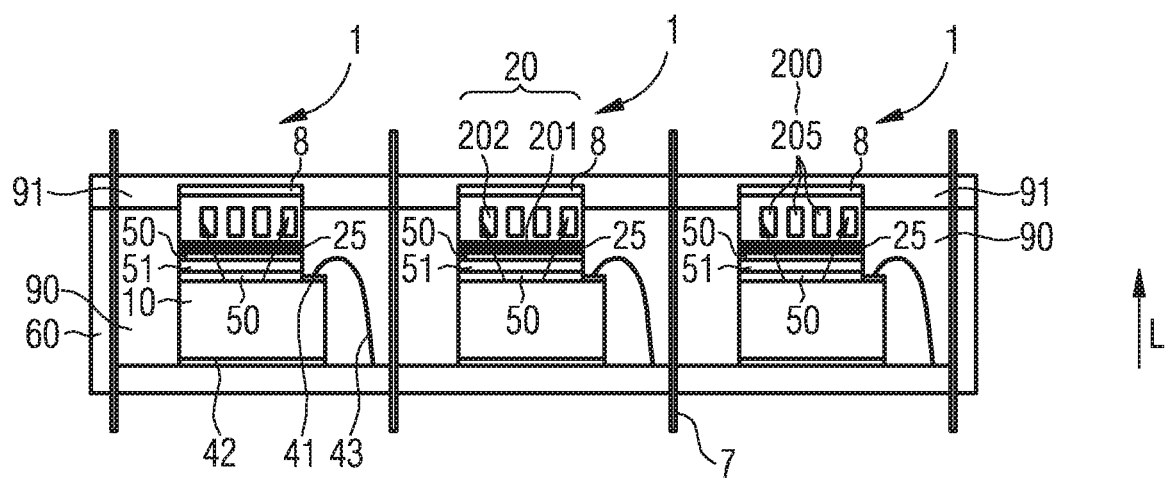
Figure 11B:
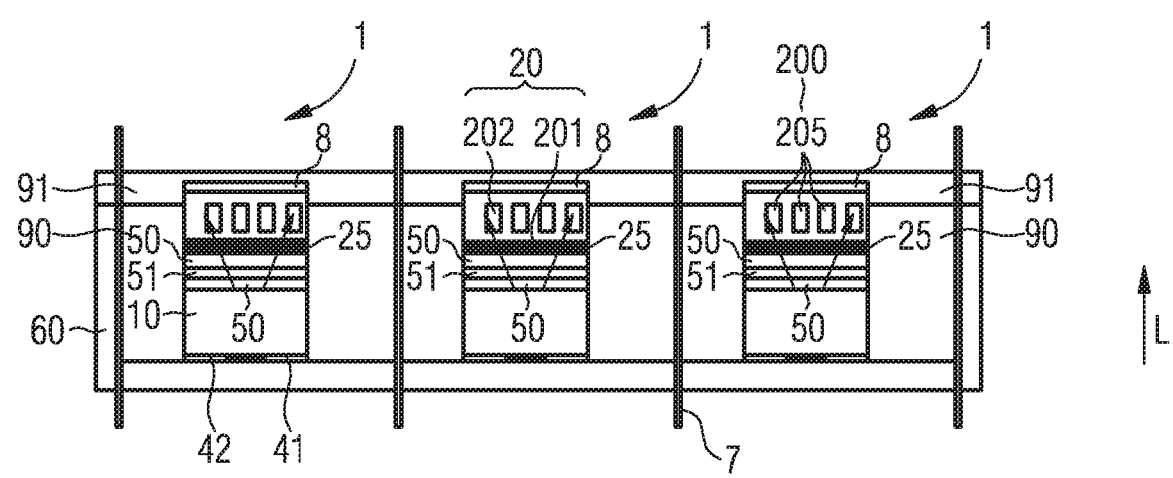

The exemplary embodiments shown in FIGS. 11A and 11B for a part of a method of manufacturing a plurality of laser diodes 1 essentially correspond to the exemplary embodiments shown in FIGS. 7 and 9.

In contrast, the laser diodes 1 each comprise a mask 25, a spacer 51 and, in particular, an anti-reflection layer 8. The laser diode 1 described in connection with FIGS. 1 to 9 may also comprise such a mask 25 and/or such a spacer 51, wherein the mask 25 and the spacer 51 are described in more detail in particular in connection with FIGS. 10A to 10C. According to FIGS. 11A and 11B, the cladding 90 completely covers the side surfaces of the semiconductor laser 10, the mask 25 and/or the spacer 51 as well as the connection layer 50 or the connection layers 50. The antireflection layer 8 is free of a covering by the cladding 90. Apart from one side facing the optical element 20, the antireflection layer 8 in particular is completely covered by the cover layer 91.

Deviating from the FIGS. 8, 9, 10B, 10C and 11B, it is possible that the finished laser diode 1 is free of a housing 60, as shown in these figures. For example, the housing 60 can be completely removed from the laser diode 1 or from the laser diodes 1. Such a laser diode 1 has a rear side, which is formed in particular by the rear side of the semiconductor laser 10 and/or by the rear surface of the cladding 90. In particular, the contact surfaces 41 and 42 on the rear side of the laser diode 1 are freely accessible. In particular, such a laser diode 1 is formed as a surface-mountable component. A vertical overall height of the laser diode 1 is given in particular exclusively by the sum of the vertical heights of the cladding 90 and the cover layer 91. A mechanically stable and flat CSP component (Chip-scale package) with a particularly low overall height can thus be achieved.

The patent application claims the priority of German patent application DE 10 2017 112 235.4, the disclosure content of which is hereby incorporated by reference.

The invention is not restricted to the exemplary embodiments by the description on the basis of said exemplary embodiments. Rather, the invention encompasses any new feature and also any combination of features, which in particular comprises any combination of features in the patent claims and any combination of features on the exemplary embodiments, even if this feature or this combination itself is not explicitly specified in the patent claims or exemplary embodiments.

The invention claimed is:

1. A laser diode comprising:
    a surface emitting semiconductor laser configured to emit electromagnetic radiation; and
    an optical element arranged downstream of the semiconductor laser in a radiation direction,
    wherein the optical element comprises a diffractive structure or a meta-optical structure or a lens structure,
    wherein the optical element and the semiconductor laser are cohesively connected to each other by a connector, and
    wherein the connector surrounds the semiconductor laser and the optical element in lateral directions.

2. The laser diode according to claim 1, wherein the optical element is in direct contact with a radiation exit surface of the surface emitting semiconductor laser facing the optical element.

3. The laser diode according to claim 1, wherein the optical element is formed with a material having the same refractive index as the connector.

4. The laser diode according to claim 1, wherein a region between the optical element and the semiconductor laser is filled with non-gaseous material.

5. The laser diode according to claim 1, wherein the optical element does not completely cover a radiation exit surface of the semiconductor laser facing the optical element.

6. The laser diode according to claim 1, wherein the optical element terminates flush with the semiconductor laser in the lateral directions.

7. The laser diode according to claim 1, wherein the diffractive structure or the meta-optical structure or the lens structure is arranged at a distance from a radiation exit surface of the semiconductor laser facing the optical element.

8. The laser diode according to claim 1, further comprising an anti-reflection layer arranged exclusively on an outwardly exposed surface of the optical element.

9. The laser diode according to claim 1, further comprising an electrical contact surface arranged on a surface of the semiconductor laser facing the optical element, wherein the contact surface is not covered by the optical element.

10. The laser diode according to claim 1, wherein the semiconductor laser comprises electrical contact surfaces exclusively on a side facing away from the optical element.

11. The laser diode according to claim 1, further comprising:
    a mask,
    wherein the mask is formed in a vertical direction between the optical element and the semiconductor laser, and
    wherein the mask is configured to generate a pictogram.

12. The laser diode according to claim 11, further comprising:
    a spacer,
    wherein the spacer is arranged in the vertical direction between the optical element and the semiconductor laser,
    wherein the spacer is transparent for the radiation emitted by the semiconductor laser,
    wherein the spacer is set at a predetermined distance between the mask and the semiconductor laser, and
    wherein the semiconductor laser, the spacer and the optical element are cohesively connected to each other.

13. The laser diode according to claim 1,
    wherein the semiconductor laser and the optical element are laterally enclosed by a cladding,
    wherein the semiconductor laser and the optical element remain uncovered from the cladding in plan view, and
    wherein the cladding is configured to reflect or absorb the electromagnetic radiation.

14. The laser diode according to claim 13,
    wherein the cladding comprises a material which is radiation-absorbing at least for visible light or for light in an infrared spectral range,
    wherein the cladding completely laterally encloses the semiconductor laser and the optical element, and
    wherein the cladding partially covers side surfaces of the optical element such that the side surfaces of the optical element remain uncovered by the cladding at least from a vertical height or at least from an upper edge of the diffractive structure, the meta-optical structure or the lens structure.

15. The laser diode according to claim 13,
    wherein the cladding completely covers side surfaces of the semiconductor laser,
    wherein the cladding at least partially covers side surfaces of the optical element,
    wherein the semiconductor laser and the optical element are covered in plan view by a cover layer transmissive for radiation, and
    wherein the cover layer adjoins the cladding.

16. The laser diode according to claim 15,
    wherein a material of the cladding is not transmissive for radiation and the cladding is not transmissive for light in an infrared spectral range, and
    wherein a material and a layer thickness of the cover layer are selected such that the cover layer is not transmissive for light in a visible spectral range and transmissive for light in the infrared spectral range.

17. A method of manufacturing a laser diode, the method comprising:
    providing a plurality of surface emitting semiconductor lasers in a first composite;
    providing a plurality of optical elements in a second composite;
    cohesively connecting the plurality of optical elements in the second composite and the plurality of semiconductor lasers in the first composite, wherein the optical element and the semiconductor laser are at least partially encapsulated or injected in a cladding body formed by a connector; and singulating the optical elements and the semiconductor laser, wherein after singulating exactly one optical element is assigned to each semiconductor laser.

18. A laser diode comprising:

a surface emitting semiconductor laser configured to emit electromagnetic radiation;

an optical element arranged downstream of the semiconductor laser in a radiation direction; and a mask, wherein the optical element comprises a diffractive structure or a meta-optical structure or a lens structure, wherein the optical element and the semiconductor laser are cohesively connected to each other, wherein the mask is arranged in a vertical direction between the optical element and the semiconductor laser, and wherein the mask is configured to generate a pictogram.

19. The laser diode according to claim 18, further comprising:

a spacer, wherein the spacer is arranged in the vertical direction between the optical element and the semiconductor laser, wherein the spacer is transparent for the radiation emitted by the semiconductor laser, wherein the spacer is set at a predetermined distance between the mask and the semiconductor laser, and wherein the semiconductor laser, the spacer and the optical element are cohesively connected to each other.

20. The laser diode according to claim 18, wherein the semiconductor laser, the mask and the optical element are laterally enclosed by a cladding, wherein the semiconductor laser and the optical element remain uncovered from the cladding in plan view, and wherein the cladding is configured to reflect or absorb the electromagnetic radiation.

* * * * *